(12) United States Patent
Takeuchi et al.

(10) Patent No.: US 7,288,725 B2
(45) Date of Patent: Oct. 30, 2007

(54) WIRED CIRCUIT BOARD

(75) Inventors: Yoshihiko Takeuchi, Osaka (JP); Mitsuru Honjo, Osaka (JP); Tetsuya Ohsawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/433,503

(22) Filed: May 15, 2006

(65) Prior Publication Data

US 2006/0266545 A1 Nov. 30, 2006

(30) Foreign Application Priority Data

May 24, 2005 (JP) ............................. 2005-151426

(51) Int. Cl.
*H05K 1/16* (2006.01)
(52) U.S. Cl. ...................... 174/260; 174/255
(58) Field of Classification Search ................ 174/260, 174/521, 523, 255; 361/760
See application file for complete search history.

(56) References Cited

U.S. PATENT DOCUMENTS 5,218,234 A * 6/1993 Thompson et al. ......... 257/787
5,925,445 A * 7/1999 Suzuki ....................... 428/209
5,953,589 A * 9/1999 Shim et al. ................. 438/106
2002/0119595 A1* 8/2002 Kim et al. .................. 438/106

FOREIGN PATENT DOCUMENTS

JP 2001-244384 9/2001

* cited by examiner

*Primary Examiner*—Ishwar (I. B.) Patel
(74) *Attorney, Agent, or Firm*—Akerman Senterfitt; Jean C. Edwards

(57) ABSTRACT

A wired circuit board prevents a sealing resin filled in an electronic component mounting portion from overflowing and spreading to a different area other than the electronic component mounting portion. An electronic component placing area is provided in the electronic component mounting portion for the electronic component to be placed and terminals are located within the electronic component placing area and formed to extend continuously with the conductive wires. Also, a groove extending around the electronic component mounting portion to intersect with the conductive wires is formed in the insulating cover layer. Further, protrusions protruding in a direction of the conductive wires being extended in the groove are formed at an intersecting portion thereof with the conductive wires. This can reduce a tendency of the overly filled sealing resin to flow over the groove, thus preventing the spread of the sealing resin from the groove to the outside thereof.

5 Claims, 6 Drawing Sheets

WIRED CIRCUIT BOARD

CROSS REFERENCE TO RELATED APPLICATIONS

This application claims priority from Japanese Patent Appln. No. 2005-151426, filed May 24, 2005, the contents of which are herein incorporated by reference in their entirety.

BACKGROUND OF THE INVENTION

1. Field of the Invention

The present invention relates to a wired circuit board and, more particularly, to a wired circuit board for an electronic component to be mounted.

2. Description of the Related Art

When an electronic component, such as a semiconductor device, is mounted on the wired circuit board, after the electronic component is placed in an electronic component mounting portion of the wired circuit board, for the connection between terminals of a conductive pattern of the wired circuit board and terminals of the electronic component, a sealing resin is filled in a space between the electronic component and the electronic component mounting portion, to seal that space with it.

This mounting of the electronic component involves a possible problem that when filled in the space between the electronic component and the electronic component mounting portion, the sealing resin may be filled more than is necessary so that an excess sealing resin may flow over from the space and spread to a different area other than the electronic component mounting portion to cause contamination of the wired circuit board.

Prior art proposes an attempt solution for, for example, a bare chip mounted on a printed wiring board and sealed with a sealing resin composition, according to which a groove is formed along a bare chip mounting portion of the printed wiring board and near the outside of the edge of the bare chip mounting portion, for preventing the spread of the sealing resin composition filled (Cf. JP Laid-open (Unexamined) Patent Publication No. 2001-244384, for example).

However, as described in JP Laid-open (Unexamined) Patent Publication No. 2001-244384 cited above, even when such the groove is formed in proximity to the outside of the edge of the electronic component mounting portion, there still remains the possibility that if the sealing resin is overly filled, then it may flow over the groove and spread to a different area therefrom. With an increase in wiring density of the conductive pattern, in particular, a further reliable measurement to prevent the overflow of the sealing resin is being demanded increasingly.

SUMMARY OF THE INVENTION

It is an object of the present invention to provide a wired circuit board that can reliably prevent the sealing resin filled in the electronic component mounting portion from overflowing and spreading to a different area other than the electronic component mounting portion.

The present invention provides a novel wired circuit board comprising an insulating base layer, a plurality of conductive wires formed on the insulating base layer, an insulating cover layer formed on the insulating base layer to cover the conductive wires, and an electronic component mounting portion for an electronic component to be mounted, wherein the electronic component mounting portion is formed by opening the insulating cover layer and comprises an electronic component placing area for the electronic component to be placed and terminals located within the electronic component placing area and formed to extend continuously with the conductive wires and electrically connect with the electronic component, wherein a groove extending around the electronic component mounting portion to intersect with the conductive wires is formed in the insulating cover layer, and wherein the groove is formed to have protrusions protruding in a direction of the conductive wires being extended in at least one intersecting portion thereof with the conductive wires.

In the wired circuit board of the present invention, it is preferable that the groove is formed to have the protrusions protruding toward the electronic component mounting portion in the at least one intersecting portion thereof with the conductive wires.

In the wired circuit board of the present invention, it is preferable that the groove is formed to have the protrusions protruding in directions opposite to each other with respect to the extending direction of the conductive wires in at least two mutually adjacent intersecting portions with the conductive wires.

In the wired circuit board of the present invention, it is preferable that the groove is formed to have orthogonal oriented portions extending between at least two mutually adjacent intersecting portions of the conductive wires in a direction orthogonal to the extending direction of the conductive wires.

In the wired circuit board of the present invention, it is preferable that the groove is in the form of a multiple groove formed around the electronic component mounting portion and arranged multiply along the extending direction of the conductive wires.

In the wired circuit board of the present invention, the groove extending around the electronic component is formed in the insulating cover layer mounting portion to intersect with a plurality of conductive wires to have the protrusions protruding in an extending direction of the conductive wires being extended at least one intersecting portion thereof with the conductive wires. This construction can provide the result that even when the sealing resin is filled overly in the electronic component mounting portion, the overly filled sealing resin can surely prevent from spreading from the groove to the outside by the groove thus constructed.

In detail, the groove is formed around the electronic component mounting portion to intersect with the conductive wires and also formed to have a shallower depth at the intersecting portions thereof with the conductive wires than a depth at the portions other than the intersecting portions by an extent corresponding to a thickness of the conductive wire. When the sealing resin is filled overly, there is a possibility that the overly filled sealing resin may flow over the part of the groove of shallower depth at the intersecting portions with the respective conductive wires and spread therefrom.

However, since the groove has the protrusions protruding in the extending direction of the conductive wires at the intersecting portions with the respective conductive wires, a tendency of the overly filled sealing resin to flow over the groove can be reduced, thus preventing the spread of the sealing resin from the groove to the outside thereof. As a result, the spread of the sealing resin filled in the electronic component mounting portion to a different area other than the electronic component mounting portion can be prevented reliably.

DETAILED DESCRIPTION OF THE INVENTION

Figure 1:
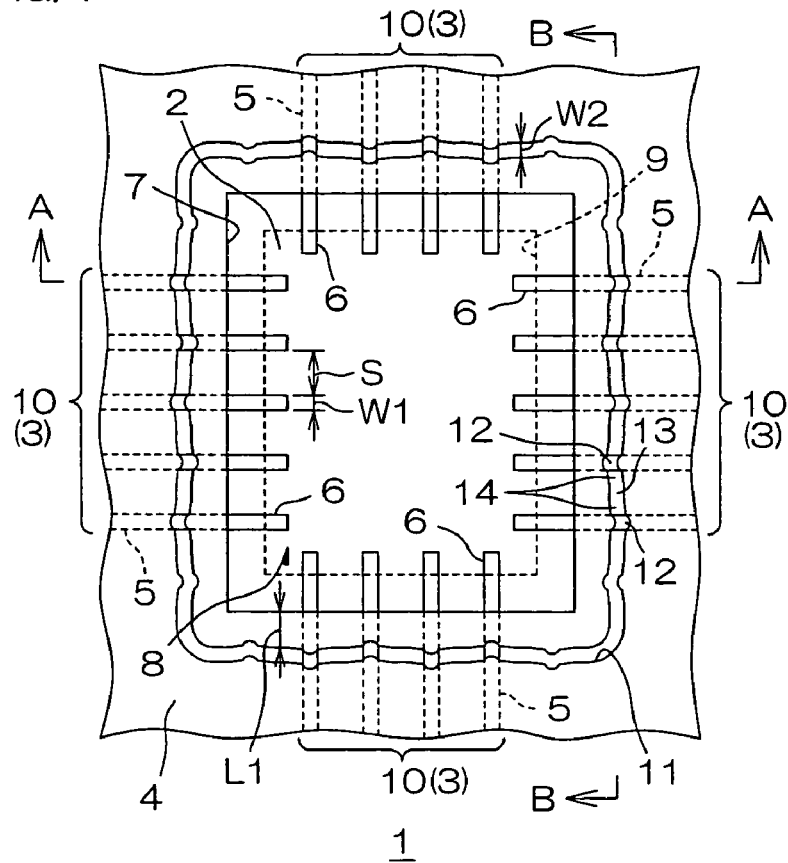
FIG. 1 is a plan view of a principal part of an electronic component mounting portion of an embodiment of a wired circuit board of the present invention.
Figure 2:
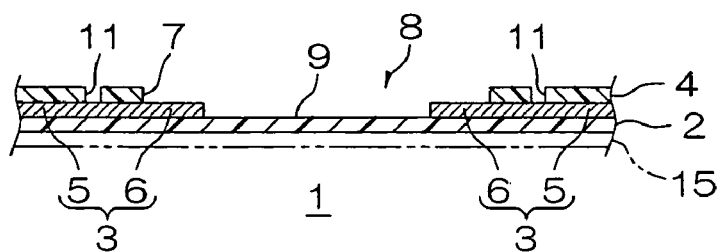
FIG. 2 is a sectional view of FIG. 1 taken along line A-A.
Figure 3:
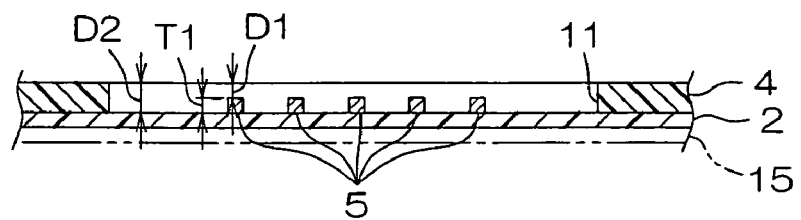
FIG. 3 is a sectional view of FIG. 1 taken along line B-B.
Figure 4:
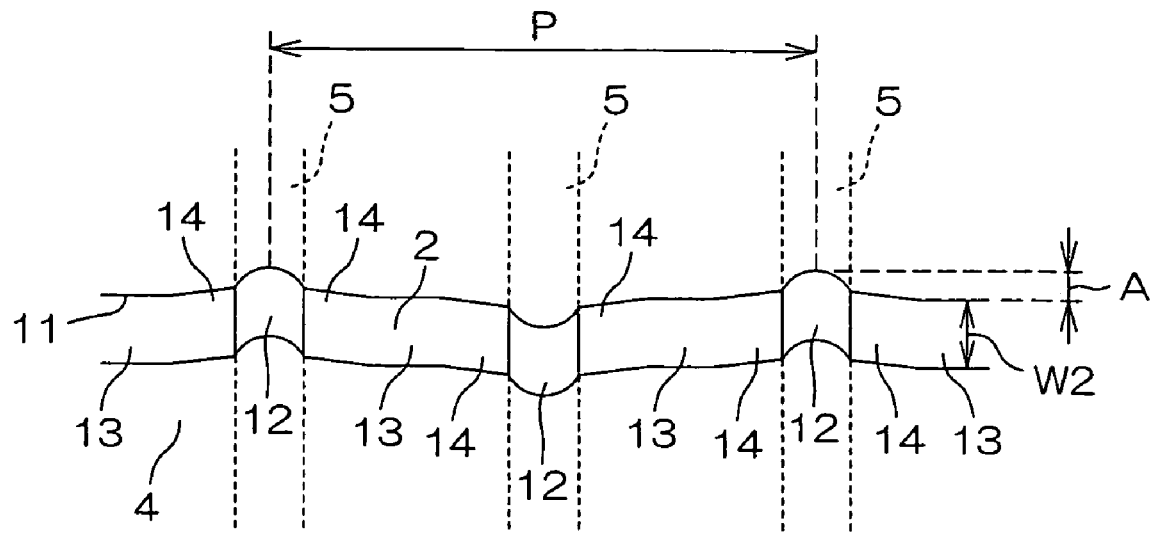
FIG. 4 is an enlarged plan view of the principal part of FIG. 1.

FIG. 1 is a plan view of a principal part of an electronic component mounting portion of an embodiment of a wired circuit board of the present invention. FIG. 2 is a sectional view of FIG. 1 taken along line A-A, and FIG. 3 is a sectional view of FIG. 1 taken along line B-B. FIG. 4 is an enlarged plan view of the principal part of FIG. 1.

As shown in FIGS. 1 and 2, this wired circuit board 1 comprises an insulating base layer 2, a conductive pattern 3 formed on the insulating base layer 2, and an insulating cover layer 4 formed on the insulating base layer 2 to cover the conductive pattern 3.

The insulating base layer 2 is formed of a synthetic resin, such as, for example, polyimide, polyamide imide, acryl, polyether nitrile, polyether sulfone, polyethylene terephthalate, polyethylene naphthalate and polyvinyl chloride. Polyimide, is preferably used for the insulating base layer 2. The insulating base layer 2 has a thickness of e.g. 3-20 μm, or preferably 8-12 μm.

The conductive pattern 3 is formed of a metal foil, such as, for example, a copper foil, a nickel foil, a gold foil, a solder foil, or their alloy foils. The conductive pattern 3 has a thickness of e.g. 5-25 μm, or preferably 8-15 μm.

The conductive pattern 3 is formed in an integrated manner by a plurality of conductive wires 5 and a plurality of terminals 6 extending continuously from the respective conductive wires 5 and serving to form an electronic component mounting portion 8, as mentioned later. The conductive wires 5 are formed to extend in parallel with and be spaced from each other. The terminals 6 extending from the respective conductive wires 5 are placed in an electronic component placing region 9 as described below.

The insulating cover layer 4 is formed of the same synthetic resin as that of the insulating base layer 2 and has a thickness of e.g. 1-15 μm, or preferably 3-8 μm.

Also, the insulating cover layer 4 has an opening 7 formed to an electronic component mounting portion 8 mentioned below. The opening 7 is formed at a prescribed position where the electronic component mounting portion 8 of the wired circuit board 1 is to be formed and is formed in a generally rectangular form, when viewed from top, 300-5,000 μm, or preferably 500-3,000 μm, on a side.

Figure 5:
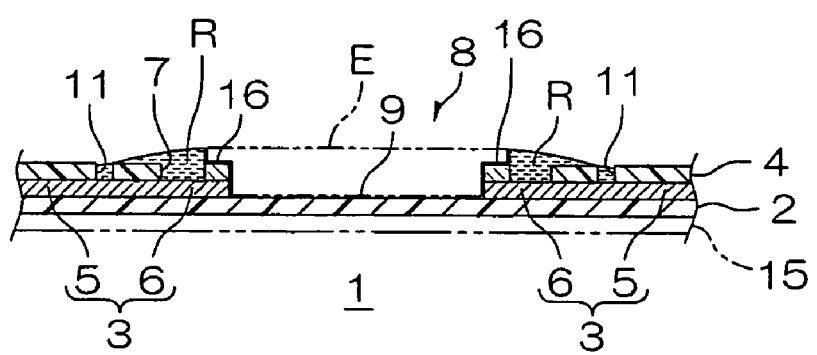
FIG. 5 shows a mounting state of the electronic component of FIG. 2.

This wired circuit board 1 also has the electronic component mounting portion 8 formed to mount an electronic component E, such as a semiconductor device on it (Cf. FIG. 5).

The electronic component mounting portion 8 is formed as an aperture portion of the opening 7 of the insulating cover layer 4. This electronic component mounting portion 8 comprises an electronic component placing area 9 for the electronic component E to be placed and the terminals 6 of the conductive pattern 3 placed in the electronic component placing area 9.

The conductive wires 5 of the conductive pattern 3 are formed as four wiring portions 10 corresponding to four sides of the opening 7 around the opening 7. The conductive wires 5 in each wiring portion 10 are spaced from each other and arranged to extend in parallel from a direction orthogonal to each corresponding side of the opening 7 toward an edge on the each corresponding side of the opening 7. As a result of this, the four wiring portions 10 are arranged in a generally cross form across the opening 7 when viewed from top.

In the each wiring portion 10, a space S between the adjacent conductive wires 5 is in the range of e.g. 5-3,000 μm, or preferably 10-2,500 μm, and a width W1 of each conductive wire 5 is in the range of e.g. 5-2,000 μm, or preferably 10-1,000 μm.

Each terminal 6 is formed by a portion of the conductive pattern 3 exposed from the opening 7. In the each wiring portion 10, the terminals 6 are formed to extend continuously from their respective conductive wires 5 to an interior of the opening 7. The terminals 6 are formed in correspondence to their respective wiring portions 10, extending from the edge on each of the four sides of the opening 7 to the interior of the opening 7 in the direction orthogonal to the edge on each side. In the opening 7, the terminals 6 grouped for each wiring portion 10 are arranged in parallel with and spaced from each other. Also, the grouped terminals 6 extending from the opposite sides of the opening 7 are spaced apart from each other in the opening 7, with their base ends placed on the margin of the opening 7 and their free ends located closer to the base end side than to the center between the opposite sides of the opening 7. The terminals 6 grouped for each corresponding wiring portion 10 and extending from each of the four sides of the opening 7 are arranged in a generally cross form, when viewed from top, across the electronic component placing area 9 mentioned below.

The electronic component placing area 9 is located in the center of the opening 7 on a surface of the insulating base layer 2 exposed from the opening 7, as depicted in a dotted line of FIG. 1 and is defined in the form of a generally rectangular area, as viewed from top, slightly smaller than the opening 7 to include all the free ends of the terminals 6 extending from each side of the four sides of the opening 7.

In this wired circuit board 1, a groove 11 is formed in the insulating cover layer 4 to surround the electronic component mounting portion 8.

The groove 11 is formed in a generally rectangular frame form slightly larger than the opening 7, as viewed from top, and the opening 7 or the electronic component mounting portion 8 is located on the inward side of the groove 11. The groove 11 is opened in such a manner that it can extend completely through the insulating cover layer 4 in the thickness direction to expose the insulating base layer 2 from the whole area of the groove 11 except the areas thereof intersecting with the conductive wires 5 mentioned later. A depth of the groove 11 corresponds to a thickness of the insulating cover layer 4 and a width W2 of the same is e.g. 20-500 μm, or preferably 50-2001 μm. The groove 11 is formed around the electronic component mounting portion 8 to extend continuously in an endless manner (in a closed manner). The groove 11 surrounds the electronic component mounting portion 8, keeping a substantially equal length L1 of e.g. 20-500 μm, or preferably 40-200 μm, between a widthwise inward edge of the groove 11 with respect to an extending direction of the conductive wires 5 and a circumferential edge of the opening 7 (which is hereinafter referred to as "the groove interval" in the examples below).

Each of the four sides of the groove 11 intersects with the conductive wires 5 of the respective wiring portions 10 in a direction perpendicular each other and the conductive wires 5 are exposed from the groove 11 at the intersecting portions.

At the intersecting portions of the respective conductive wires 5 of the groove 11, protrusions 12 are formed protruding in a direction of the respective conductive wires 5 being extended (i.e., in a widthwise direction of the groove 11).

As shown in FIG. 4, protrusions 12 are formed in such a manner that one of two adjacent protrusions 12 at the two adjacent intersecting portions protrudes to a widthwise inner side of the groove (toward the electronic component portion 8) and the other protrudes to a widthwise outer side of the groove. In other words, they are formed to alternately protrude in the opposite directions with respect to the width of the groove 11. Also, the protrusions 12 are formed protruding the groove 11 in a generally circular arc form, as viewed from top, with respect to the respective orientations of the protrusions 12.

The groove 11 has orthogonal oriented portions 13 extending between two adjacent intersecting portions (i.e., between the respective protrusions 12) in a direction orthogonal to the extending direction of the conductive wires 5 which intersect with the groove 11 at the two intersecting portions.

Figure 9:
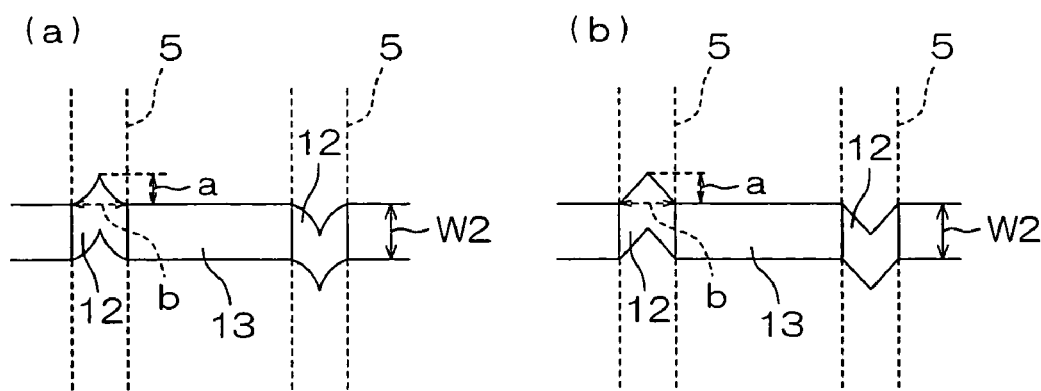
FIG. 9 is a plan view showing an embodiment of a protruding portion of the groove, (a) showing a generally V-shaped groove portion with both slant sides curved and converged to a sharp tip, when viewed from top, (b) showing a generally V-shaped groove portion with both slant sides extending straight and converged to an angled tip, when viewed from top.

The orthogonal oriented portions 13 may be formed to extend over the entire length between the two intersecting portions (Cf. FIG. 9), as mentioned later, or may be formed to extend in part of the length therebetween, as shown in FIG. 4.

In the case of the orthogonal oriented portions 13 being formed in part of the length therebetween, then connecting portions 14 are formed between the two adjacent protrusions 12 and the orthogonal oriented portions 13 sandwiched between the two adjacent protrusions 12, for connection therebetween. The connecting portions 14 extend obliquely from the protrusions 12 in the extending direction of the protrusions 12 and connect to the orthogonal oriented portions 13.

As a result of this, the groove 11 is formed in an endless manner to have a repeated pattern of a sequence of the protrusions 12, the orthogonal oriented portions 13, and the connecting portions 14, as shown in FIG. 1.

As shown in FIG. 4, the protrusions 12 in the groove 11 are arranged with a pitch P (between two adjacent protrusions 12) of e.g. 50-2,000 μm, or preferably 80-1,500 μm, and with a level difference A between a widthwise innermost portion of the protrusion 12 and a widthwise outermost portion of the orthogonal oriented portion 13 (which is hereinafter referred to as "amplitude" in the examples below) of e.g. 50-1,000 μm, or preferably 80-800 μm.

This wired circuit board 1 can be produced by the same producing method as that of the common wired circuit board 1. Specifically, the insulating base layer 2 formed of e.g. polyimide and the like is prepared by a casting method or is prepared in the form of a dry film, first. Then, the conductive pattern 3 of a copper foil and the like with the conductive wires 5 and the terminals 6 is formed on the insulating base layer 2 by a known patterning process, such as additive process or subtractive process. Then, after a liquid solution containing a photosensitive polyamide acid (photosensitive polyimide precursor) is coated over the insulating base layer 3 to cover the conductive pattern 3, it is exposed to light and developed to be patterned. Then, the patterned coating thus obtained is heated and cured to thereby produce the insulating cover layer 4 formed of polyimide and the like. The opening 7 is formed in the process of patterning of the insulating cover layer 4 by subjecting the photosensitive polyamide acid to the patterning to expose a corresponding area to the electronic component mounting portion 8.

In this wired circuit board 1, a stiffening layer 15 may be laminated on the back side of the insulating base layer 2 (the side opposite to the side (front side) on which the conductive pattern 3 is laminated), as depicted by a phantom line of FIG. 2.

The stiffening layer 15 is formed of a foil of e.g. stainless steel, 42 alloy, aluminum, copper-beryllium, and phosphor bronze, having a thickness of e.g. 10-200 μm, or preferably 15-150 μm.

For the lamination of the stiffening layer 15, the following steps are taken in the producing method mentioned above. The stiffening layer 15 of e.g. a stainless steel foil is prepared, first. Then, after a liquid solution containing a photosensitive polyamide acid (photosensitive polyimide precursor) is coated over the stiffening layer 15, it is exposed to light and developed to be patterned. Then, the patterned coating thus obtained is heated and cured of heat to thereby produce the insulating base layer 3 of polyimide and the like. If necessary, the insulating cover layer 4 is formed. Thereafter, the stiffening layer 15 is patterned by etching.

When an electronic component E, such as a semiconductor device and the like, is mounted on the wired circuit board 1 thus formed, the electronic component E is first set in place in the electronic component placing area 9 so that the terminals 6 of the conductive pattern 3 and the terminals (not shown) of the electronic component E can be electrically connected to each other through solder bumps 16 and the like, as shown in FIG. 5. Then, a sealing resin R is filled in a space between the electronic component E and the electronic component mounting portion 8, to seal the space therewith.

The sealing resin R comprises liquid resin of fluidity including for example, a phenol resin, an epoxy resin, and a polyimide resin. After the sealing resin R is poured in a space between the electronic component E and the electronic component mounting portion 8, it is cured.

When the sealing resin R is filled in that space, there is a possibility that the sealing resin R may be filled more than is necessary so that an excess sealing resin R may flow over from the space and spread to a different area in the surface of the insulating cover layer 4 other than the electronic component mounting portion 8 to cause contamination of the wired circuit board 1.

The wired circuit board 1 is constructed so that the groove 11, which is formed in the insulating cover layer 4 to surround the electronic component mounting portion 8 and extend in the direction orthogonal to the grouped conductive wires 5 in the respective wiring portions 10, is formed to have the protrusions 12 formed at the intersecting portions intersecting to the conductive wires 5. This construction can provide the result that even when the sealing resin R is filled overly in the electronic component mounting portion 8, as mentioned above, the overly filled sealing resin R is directed to flow into the groove 11 so as to stop the flow. This can surely prevent the spread of the sealing resin R from the inside of the groove 11 (in which the electronic component mounting portion 8 is placed) to the outside thereof.

In detail, the groove 11 is formed around the electronic component mounting portion 8 to extend in the direction orthogonal to the grouped conductive wires 5 of the respective wiring portions 10. Also, the groove 11 is formed to have a shallower depth D1 at the intersecting portions with the conductive wires 5 than a depth D2 between the adjacent intersecting portions by an extent corresponding to a thickness T1 of the conductive wire 5, as shown in FIG. 3. When the sealing resin R is filled overly, the sealing resin R may flow over the part of the groove 11 of shallower depth at the intersecting portions with the respective conductive wires 5 and spread therefrom.

However, since the groove 11 has the protrusions 12 protruded in the extending direction of the conductive wires 5 at the intersecting portions with the respective conductive wires 5, as shown in FIG. 4, a tendency of the overly filled sealing resin R to flow over the groove 11 can be reduced, thus preventing the spread of the sealing resin R from the inside of the groove 11 (in which the electronic component mounting portion 8 is placed) to the outside thereof. As a result, the spread of the sealing resin R filled in the electronic component mounting portion 8 to a different area other than the electronic component mounting portion 8 can be prevented reliably.

Figure 6:
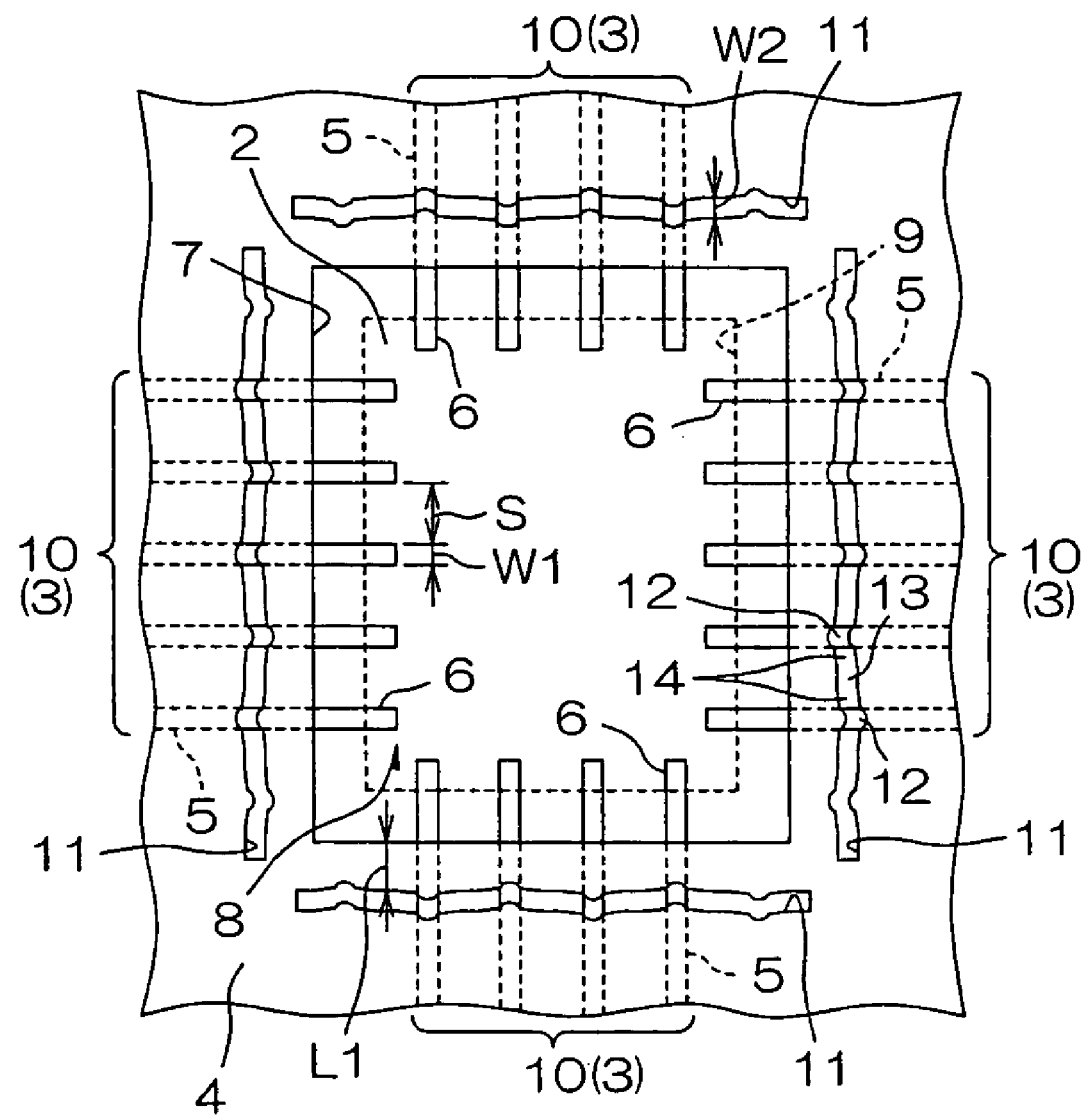
FIG. 6 is a plan view of a principal part of a surrounding area of an electronic component mounting portion of another embodiment of the wired circuit board of the present invention (the formation of a split groove formed around the electronic component mounting portion)

Although the embodiment wherein the groove 11 is formed around the electronic component mounting portion 8 to extend continuously in an endless manner (in a closed manner) has been described above, the groove 11 around the electronic component mounting portion 8 may for example be divided into segments to extend discontinuously therearound, as shown in FIG. 6.

In the embodiment shown in FIG. 6, the groove 11 is divided into four parts corresponding to the four sides of the opening 7. The four parts of the groove 11 are located at the outside of the opening 7 at spaced intervals with their respective sides of the opening 7, to confront the opening 7. Alternatively, the groove 11 may be divided into e.g. two parts in a generally L-shape when viewed from top to surround the opening 7, though not shown in FIG. 6. Further, the groove 11 is not necessarily formed to face all of the four sides of the opening 7. For example, two linear parts of the groove 11 may be formed and arranged in parallel with each other to correspond to the opposite sides of the opening 7, for intended purposes and applications. Alternatively, two L-shaped parts may be formed to correspond to two adjacent sides of the opening 7.

Figure 7:
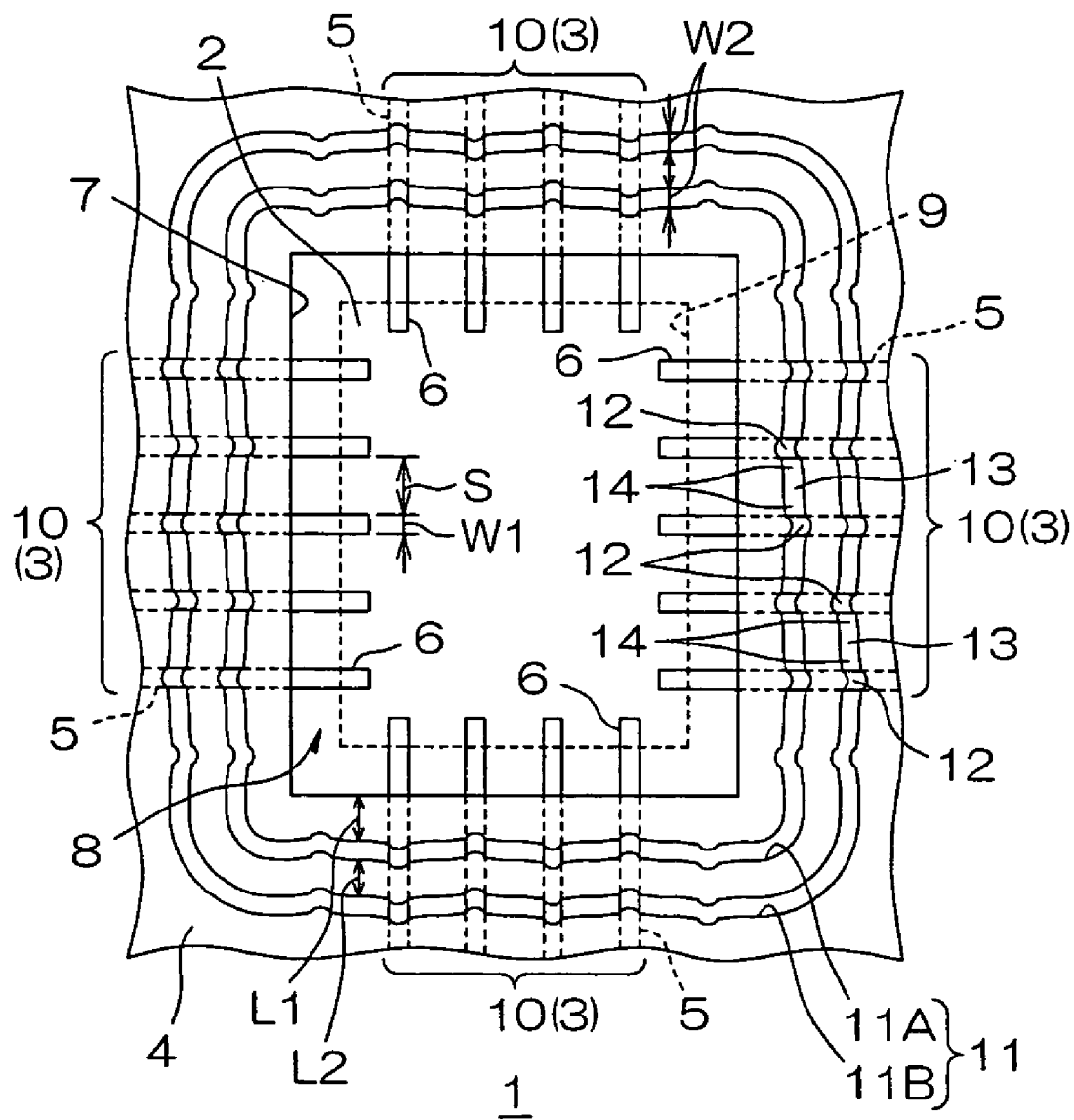
FIG. 7 is a plan view of a principal part of a surrounding area of an electronic component mounting portion of still another embodiment of the wired circuit board of the present invention (the formation of a multiple groove formed around the electronic component mounting portion)

Further, the groove 11 may be formed in a multiple groove around the electronic component mounting portion 8 and arranged multiply in the extending direction of the grouped conductive wires 5 of the respective wiring portions 10, for intended purposes and applications, as shown in FIG. 7.

In the embodiment shown in FIG. 7, the groove 11 is formed in a double groove 11 comprising an inner endless groove 11A formed in a generally rectangular frame form slightly larger than the opening 7 and an outer endless groove 11B formed in a generally rectangular frame form slightly larger than the inner groove 11A to surround the inner groove 11A when viewed from top. A length L2 from a widthwise inner edge of the outer groove 11B to a widthwise outer edge of the inner groove 11A (which is hereinafter referred to as "the groove interval" in the examples below) is e.g. 20-500 µm, or preferably 40-200 µm.

Also, the groove 11 may be formed in a triple groove or a quadruple groove, for intended purposes and applications, as well as the double groove of FIG. 7. For example, the groove 11 may be formed in a single to fifteenfold groove, or preferably a double to tenfold groove.

Figure 8:
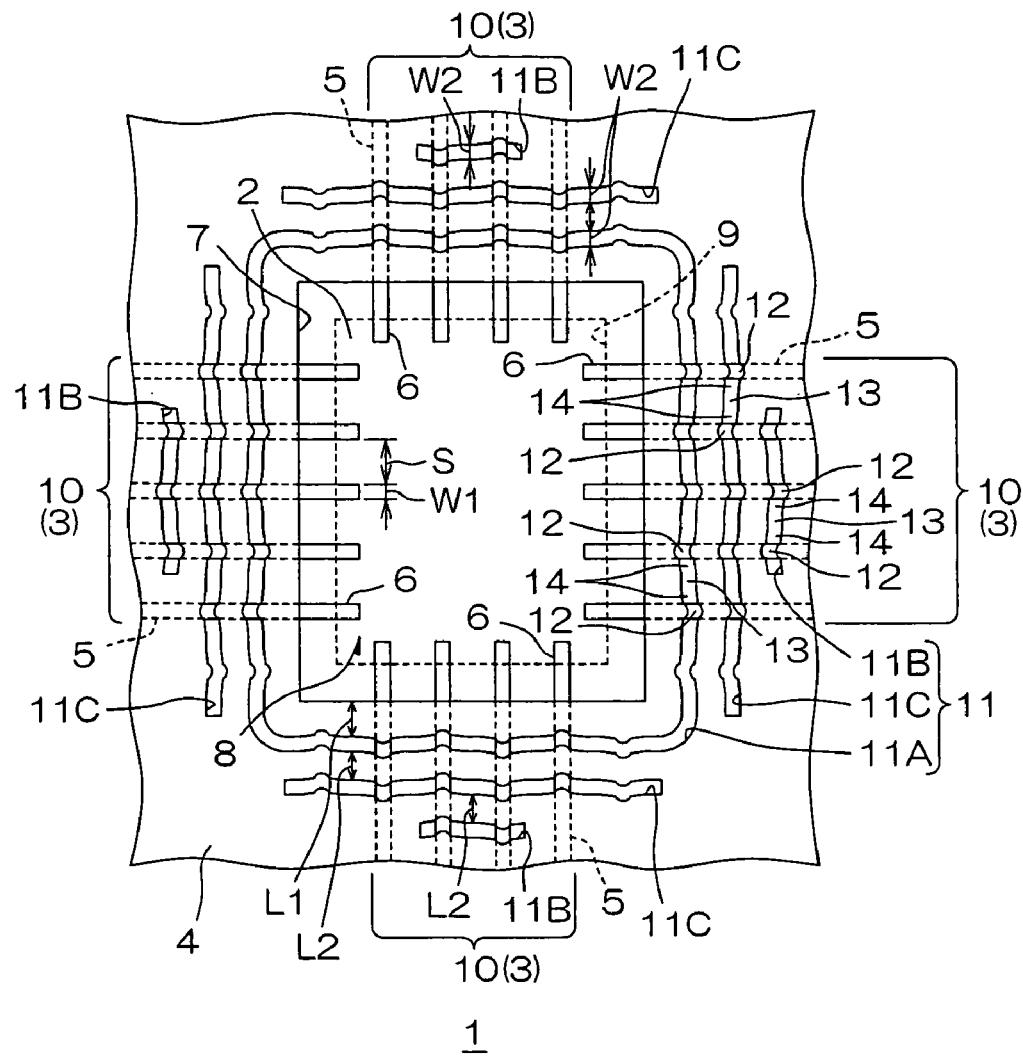
FIG. 8 is a plan view of a principal part of a surrounding area of an electronic component mounting portion of yet another embodiment of the wired circuit board of the present invention (the formation of a triple groove comprising an inner endless groove, intermediate grooves in split form, and outer grooves in split form)

Further, the groove 11 may be formed in a variant of the triple groove shown in FIG. 8 comprising an inner endless groove 11A in a generally rectangular frame form slightly larger than the opening 7 to surround the opening 7, four intermediate groove parts 11C formed at the outside of the inner groove 11A at spaced intervals with the four sides of the inner groove 11A, to confront the inner groove 11A, and four outer groove parts 11B formed to be shorter than the intermediate groove parts 11C and located at the outside of the intermediate groove parts 11C at spaced intervals with the four sides of the intermediate groove parts 11C, to confront the intermediate groove parts 11C.

Although the embodiment wherein the protrusions 12 are formed to protrude in a generally circular arc form, when viewed from top, to the respective orientations of the widthwise direction of the groove 11 has been described above, no particular limitation is imposed on the shape of the protrusions 12. For example, the protrusions 12 may be formed in a generally V-shape with both slant sides curved and converged to a sharp tip, when viewed from top, as shown in FIG. 9(a), or may be formed in a generally V-shape with both slant sides extending straight and converged to an angled tip, when viewed from top, as shown in FIG. 9(b).

In the embodiments shown in FIG. 9(a) and FIG. 9(b), the orthogonal oriented portions 13 are formed to extend continuously from the protrusions 12, and the groove 11 is formed to have a repeated pattern of a sequence of the protrusions 12 and the orthogonal oriented portions 13.

Also, in FIG. 9(a) and FIG. 9(b), a height of the protrusion 12 (a difference between a widthwise innermost portion of the protrusion 12 and a widthwise innermost portion of the orthogonal oriented portion 13) is e.g. 30-1,000 µm, or preferably 60-800 µm, and a width b of the protrusion 12 (a distance between the orthogonal oriented portions 13) is e.g. 5-2,000 µm, or preferably 10-1,000 µm.

In some situations, the protrusions 12 are not necessarily formed at all the intersecting portions of the groove 11 to the conductive wires 5. For example, the protrusions 12 may be formed at appropriately selected intersecting portions only, for intended purposes and applications. Also, in some situations, the protrusions 12 are not necessarily formed to protrude in mutually opposite directions with respect to the widthwise directions at two adjacent intersecting portions. For example, all the protrusions 12 may be formed to protrude to the widthwise inner side (the electronic component mounting portion 8 side) only or to the widthwise outer side only. It is preferable that the protrusions 12 are formed to the widthwise inner side (the electronic component mounting portion 8 side) rather than to the widthwise outer side.

Figure 10:
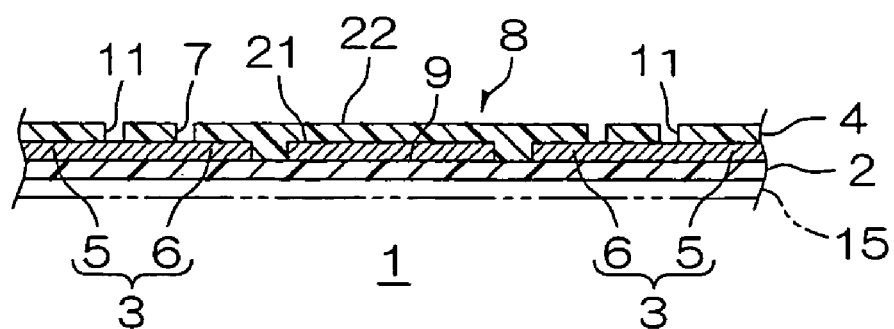
FIG. 10 is a sectional view, corresponding to FIG. 2, of another embodiment of the wired circuit board of the present invention (wherein a center terminal portion and a terminal cover are formed)

Although the embodiments wherein the electronic component mounting portion 8 includes the electronic component placing area 9 for the electronic component E to be placed and the terminals 6 of the conductive pattern 3 located at the inside of the electronic component placing area 9, the electronic component placing area 9 and the terminals 6 being located in the opening 7 of the insulating cover layer 4, has been described above, for example a center heat-radiating terminal portion 21 as the conductive pattern 3 may be additionally formed in the electronic component placing area 9 at locations thereof inwardly of the electronic component placing area 9 from the terminals 6, and a terminal cover 22 to cover the terminals 6 and the center terminal 21 may be formed as the insulating cover layer 4 in the electronic component placing area 9, as shown in FIG. 10.

Figure 11:
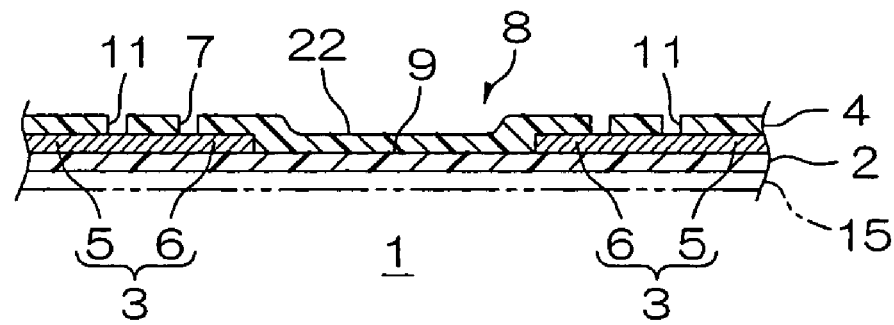
FIG. 11 is a sectional view, corresponding to FIG. 2, of still another embodiment of the wired circuit board of the present invention (wherein a terminal cover is formed).

Alternatively, only the terminal cover 22 to cover the terminals 6 may be formed as the insulating cover layer 4 in the electronic component placing area 9 without providing the center terminal portion 21, as shown in FIG. 11.

EXAMPLES

While in the following, the present invention will be described in further detail with reference to Examples, the present invention is not limited thereto.

Example 1

After a varnish of a photosensitive polyamic acid was coated over a surface of a stiffening layer of a stainless steel foil of 25 μm thick, the coating was exposed to light and then developed for patterning. Then the resulting coating was heated and cured. As a result of this, an insulating base layer of polyimide resin of 10 μm thick was formed.

Then, a conductive pattern of a copper foil of 10 μm thick was formed by the additive process. In this conductive pattern, a distance between the adjacent conductive wires was 100 μm and a width of the conductive wire was 100 μm.

Then, after the varnish of the photosensitive polyamic acid was coated over the insulating base layer to cover the conductive pattern, the coating was exposed to light and developed to be patterned so that an opening and a groove were formed. Thereafter, the coating was heated and cured. As a result of this, an insulating cover layer of polyimide resin of 5 μm thick was formed. The wired circuit board was obtained in the manner outlined above.

The opening was formed in a generally rectangular form, 1,500 μm on a side, as viewed from top.

The groove was formed as a quadruple groove in an endless manner to have a repeated pattern of a sequence of the protrusions, the orthogonal oriented portions, and the connecting portions. Each groove was formed to have a width of 100 μm and a groove interval of 50 μm. Also, the protrusions in each groove were formed to protrude in a generally circular arc, as viewed from top, in the directions opposite to each other with respect to the widthwise direction at the two intersecting portions adjacent each other. The pitch between the two adjacent protrusions was 500 μm, and the amplitude was 200 μm.

Comparative Example 1

Except that a groove with no protrusions was formed, the same processes as those in Example 1 were taken to produce a wired circuit board.

Evaluation

In Example 1 and Comparative Example 1, a semiconductor device was placed in the electronic component mounting portion of the wired circuit board and, thereafter, 0.5 mm$^3$ of an epoxy resin (sealing resin) in liquid form was filled in the space between the electronic component and the electronic component mounting portion and then heated at 165. for 30 minutes.

The respective wired circuit boards after heating were observed for conditions of overflow of the sealing resin. It was found from the observation of the wired circuit board of Example 1, the spread of the sealing resin was stopped by the innermost groove (the first groove closest to the inside). On the other hand, it was found that in the wired circuit board of Comparative Example 1, the spread of the sealing resin was stopped by the outermost groove (the fourth groove from the inside).

Then, in Example 1 and Comparative Example 1, a semiconductor device was placed in the electronic component mounting portion of the wired circuit board and, thereafter, 0.5 mm$^3$ of an epoxy resin (sealing resin) in liquid form was filled in the space between the electronic component and the electronic component mounting portion and then heated at 165. for 30 minutes.

The respective wired circuit boards after heating were observed for conditions of overflow of the sealing resin. It was found from the observation of the wired circuit board of Example 1, the spread of the sealing resin was stopped by the groove second-closest to the inside. On the other hand, it was found that in the wired circuit board of Comparative Example 1, the sealing resin spread beyond the outermost groove (the fourth groove from the inside).

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
  an insulating base layer,
  a plurality of conductive wires formed on the insulating base layer,
  an insulating cover layer formed on the insulating base layer to cover the conductive wires, and
  an electronic component mounting portion for an electronic component to be mounted, the electronic component mounting portion being formed by removing a portion of the insulating cover layer,
  a groove formed in the insulating cover layer along a perimeter of the electronic component mounting portion, the groove being formed to intersect with the plurality of conductive wires that are positioned along the perimeter of the electronic component mounting portion, and protrusions formed along the groove at intersection areas with the plurality of conductive wires that are positioned along the perimeter of the electronic component mounting portion, the protrusions being formed to extend in a lengthwise direction of the conductive wires, an electronic component placing area provided in the electronic component mounting portion to receive the electronic component, and terminals that are located within the electronic component placing area and are formed to extend continuously with corresponding ones of the plurality of conductive wires, the terminals being adapted to electrically connect with the electronic component.

2. The wired circuit board according to claim 1, wherein the protrusions extend toward the electronic component mounting portion in at least one intersection area.

3. The wired circuit board according to claim 1, wherein the protrusions extend in directions opposite to each other in at least two mutually adjacent intersection areas.

4. The wired circuit board according to claim 1, wherein the groove is formed to have orthogonal oriented portions, relative to the corresponding conductive wires, that extend between at least two mutually adjacent intersection areas.

5. The wired circuit board according to claim 1, further comprising two or more concentric grooves that are formed around the electronic component mounting portion.

* * * * *